United States Patent
Nonaka

(10) Patent No.: US 8,073,018 B2
(45) Date of Patent: Dec. 6, 2011

(54) LASER PULSE GENERATING APPARATUS AND METHOD

(75) Inventor: Koji Nonaka, Kochi (JP)

(73) Assignee: Kochi University of Technology, Kami, Kochi (JP)

( * ) Notice: Subject to any disclaimer, the term of this patent is extended or adjusted under 35 U.S.C. 154(b) by 0 days.

(21) Appl. No.: 12/665,636

(22) PCT Filed: Jun. 19, 2008

(86) PCT No.: PCT/JP2008/061244

§ 371 (c)(1),
(2), (4) Date: Mar. 24, 2010

(87) PCT Pub. No.: WO2009/153875

PCT Pub. Date: Dec. 23, 2009

(65) Prior Publication Data

US 2010/0195682 A1    Aug. 5, 2010

(51) Int. Cl.
*H01S 3/30* (2006.01)
(52) U.S. Cl. .......................................................... 372/6
(58) Field of Classification Search ............. 372/29.011; 438/28
See application file for complete search history.

(56) References Cited

U.S. PATENT DOCUMENTS

| | | | | |
|---|---|---|---|---|
| 5,151,908 | A * | 9/1992 | Huber | 372/6 |
| 6,795,479 | B2 * | 9/2004 | Yokoyama | 372/97 |
| 2002/0064353 | A1 | 5/2002 | Yokoyama | |
| 2005/0232314 | A1* | 10/2005 | Hashimoto | 372/18 |

FOREIGN PATENT DOCUMENTS

| | | |
|---|---|---|
| JP | 07-263786 | 10/1995 |
| JP | 11-326974 | 11/1999 |
| JP | 2001-308448 | 11/2001 |
| JP | 2002-164614 | 6/2002 |
| JP | 2003-031897 | 1/2003 |
| JP | 2003-264335 | 9/2003 |
| JP | 2004-317783 | 11/2004 |
| JP | 2006-339237 | 12/2006 |

(Continued)

OTHER PUBLICATIONS

Birkin, David J. L. et al., "Tunable Operation of a Gain-Switched Diode Laser by Nonresonant Self-Injection Seeding," *IEEE Photonics Technology Letters*, vol. 13, No. 11, Nov. 2001, pp. 1158-1160.

(Continued)

*Primary Examiner* — Jessica Stultz
*Assistant Examiner* — Tuan Nguyen
(74) *Attorney, Agent, or Firm* — Foley & Lardner LLP

(57) ABSTRACT

Jitter and waveform are improved by reducing the wavelength spectrum width of a laser beam pulse. In a laser pulse generating apparatus according to the present invention, a semiconductor laser device, a polarization maintaining optical fiber, an optical reflection filter having bandpass characteristics using an FBG whose passband can be changed by changing a tension, and an optical isolator are connected via an optical fiber. A driving circuit drives the semiconductor laser device to generate a pulse. The optical reflection filter performs filtering by transmitting a specific component of the wavelength spectrum of the pulse, reflects a portion of the optical power, and outputs the remaining optical power except the reflected portion to the outside via the optical isolator. The reflected pulse is fed back to the semiconductor laser device to thereby reduce the wavelength spectrum width of the laser beam, and improve the jitter and waveform.

16 Claims, 10 Drawing Sheets

FOREIGN PATENT DOCUMENTS

| | | |
|---|---|---|
| JP | 2007-035661 | 2/2007 |
| WO | WO 2005/006508 | 1/2005 |

OTHER PUBLICATIONS

Omichi, Koji et al., "Polarization Division Multiplexing Measurement of Optical Frequency Domain Reflectometry Using Polarization Maintaining Fiber Bragg Grating," *Proceedings of the 2008 IEICE General Conference*, Kitakyushu, C-3-78, Mar. 18-21, 2008, p. 259 (with English abstract).

Notice of Reasons for Rejection for JP 2009-535159 mailed Jun. 23, 2010 (with English translation).

* cited by examiner

NO FEEDBACK

FEEDBACK USING ONLY DLC

LASER PULSE GENERATING APPARATUS AND METHOD

CROSS-REFERENCE TO RELATED APPLICATIONS

The present application is a U.S. national stage application claiming the benefit of International Application No. PCT/JP2008/061244, filed on Jun. 19, 2008, the entire contents of which is incorporated herein by reference in its entirety.

TECHNICAL FIELD

The present invention relates to a laser pulse generating apparatus and method for generating a laser beam pulse.

BACKGROUND ART

For example, Patent Document 1 discloses a laser pulse generating apparatus for feeding a portion of emission light back to a semiconductor laser by using a polarization maintaining optical fiber.

Also, for example, Non-Patent Document 1 discloses an accurate measurement method of OFDR (Optical Frequency Domain Reflectometry) using an optical feedback path length where polarization is maintained by using a polarization maintaining FBG (Fiber Bragg Grading).

[Patent Document 1] Japanese Patent Laid-Open No. 2007-35661 [Non-Patent Document 1] Omichi et al., "Polarization Division Multiplexing Measurement of Optical Frequency Domain Reflectometry Using Polarization Maintaining Fiber Bragg Grating" Proceedings 1 of the 2008 IEICE General Conference, Kitakyushu, C-3-78, Mar. 18 to 21, 2008

DISCLOSURE OF THE INVENTION

Means for Solving the Problems

The invention of a laser pulse generating apparatus according to the present invention has been made in view of the background described above. To utilize a change in laser characteristics under special external light injection conditions, one embodiment according to the invention is a laser pulse generating apparatus including: a laser beam generating device; a driving device; a first light guide path; an optical filter; a second light guide path; and a reflecting device, wherein the laser beam generating device is driven to generate a laser beam having a predetermined wavelength spectrum and emit the laser beam to the first light guide path, the driving device drives the laser beam generating device to generate a pulse of the laser beam, the first light guide path guides the pulse between the laser beam generating device and the optical filter, the optical filter transmits a predetermined wavelength spectrum of the pulse entering from the first light guide path to emit the pulse having the predetermined wavelength spectrum to the second light guide path, and transmits a predetermined wavelength spectrum of the pulse entering from the second light guide path to emit the pulse having the predetermined wavelength spectrum to the first light guide path, the second light guide path guides the pulse between the optical filter and the reflecting device, and the reflecting device reflects only a portion of optical power of the pulse guided through the second light guide path to feed the portion back to the laser beam generating device via the second light guide path, the optical filter and the first light guide path.

Also, another embodiment of the invention of a laser pulse generating apparatus according to the present invention is a laser pulse generating apparatus including: a laser beam generating device; a driving device; a first light guide path; and an optical reflection filter, wherein the laser beam generating device is driven to generate a laser beam having a predetermined wavelength spectrum and emit the laser beam to the first light guide path, the driving device drives the laser beam generating device to generate a pulse of the laser beam, the first light guide path guides the pulse between the laser beam generating device and the optical reflection filter, and the optical reflection filter reflects only a portion of optical power of the pulse having a predetermined wavelength spectrum entering from the first light guide path to feed the portion back to the laser beam generating device via the first light guide path.

[Abstract]
In one embodiment of the laser pulse generating apparatus according to the present application, a semiconductor laser device, a polarization maintaining optical fiber, a polarization maintaining optical fiber, an optical reflection filter having bandpass characteristics using an FBG whose passband can be changed by changing a tension, a polarization maintaining optical fiber, a reflecting device, a normal optical fiber, and an optical isolator are connected in the above order so as to guide a laser beam via a connector or the like, if necessary.

A driving circuit for driving the semiconductor laser device allows the semiconductor laser device to generate a pulse of short duration and emit the pulse to the polarization maintaining optical fiber.

The pulse emitted from the semiconductor laser device is guided to the optical reflection filter via the optical fiber connected to the polarization maintaining optical fiber.

The optical reflection filter performs filtering by transmitting a specific component of the wavelength spectrum broadened by chirping of the pulse, and feeds a portion of the optical power of the filtered pulse back to the semiconductor laser device via the polarization maintaining optical fiber.

The optical reflection filter also transmits a large portion of the optical power of the pulse without reflecting it, and outputs the large portion to the outside via the optical fiber and the optical isolator.

In another embodiment of the laser pulse generating apparatus according to the present application, a semiconductor laser device, a polarization maintaining optical fiber, an optical filter, a polarization maintaining optical fiber, a normal optical fiber, and an optical isolator are connected in the above order so as to guide a laser beam via a connector, if necessary.

The optical filter used in the embodiment has both the function as a bandpass filter using an FBG whose passband can be changed by changing a tension, and the function of reflecting a portion of the optical power of an entering pulse.

A driving circuit for driving the semiconductor laser device allows the semiconductor laser device to generate a pulse of short duration and emit the pulse to the polarization maintaining optical fiber.

The pulse emitted from the semiconductor laser device is guided to the optical filter via the optical fiber connected to the polarization maintaining optical fiber.

The optical filter filters the pulse to feed a portion thereof back to the semiconductor laser device, and outputs the remaining portion to the outside via the polarization maintaining optical fiber, the normal optical fiber and the optical isolator.

With the configuration, the laser beam pulse having the same quality as that of the above embodiment of the laser pulse generating apparatus according to the present application can be also obtained.

The technical advantages of the invention as set forth in the claims of the present application and other technical advantages will become apparent to those skilled in the art upon reading the detailed description of the embodiments in conjunction with the drawings.

The accompanying drawings, which are incorporated in and constitute a part of the specification of the present application, illustrate the embodiments of the invention as set forth in the claims of the present application and, together with the description, serve to explain the principles of the present invention.

It should be understood that the drawings referred to in the specification of the present application are not to scale unless otherwise noted.

BRIEF DESCRIPTION OF THE DRAWINGS

The embodiments of the invention as set forth in the claims of the present application will be best understood by reference to the following description regarding their configuration and operation in conjunction with the drawings:

FIGS. 1A and 1B are views illustrating an example in which a pulse of a laser beam is fed back to a semiconductor laser device, wherein FIG. 1A illustrates a case in which a pulse repetition rate per unit time is relatively low, and FIG. 1B illustrates a case in which a pulse repetition rate per unit time is relatively high;

FIGS. 2A and 2B are views illustrating an example of a pulse waveform obtained according to the presence or absence of the feedback of the pulse of the laser beam to the semiconductor laser device, wherein FIG. 2A illustrates a pulse waveform obtained when the pulse of the laser beam is not fed back to the semiconductor laser device, and FIG. 2B illustrates a pulse waveform obtained when the pulse of the laser beam is fed back to the semiconductor laser device;

FIGS. 5A and 5B are views illustrating the schematic shape of a wavelength spectrum of the pulse of the laser beam fed back to the semiconductor laser device, wherein FIG. 5A illustrates a wavelength spectrum included in a pulse whose band is not limited, and FIG. 5B illustrates a wavelength spectrum included in a feedback pulse whose band is limited;

BEST MODE FOR CARRYING OUT THE INVENTION

In the following, the embodiments of the invention as set forth in the claims of the present application will be described in detail.

The embodiments of the invention as set forth in the claims of the present application are illustrated in the accompanying drawings.

Although the invention as set forth in the claims of the present application will be described with reference to the embodiments, it should be appreciated by those skilled in the art that the embodiments are not intended to limit the invention as set forth in the claims of the present application to the disclosure.

Rather, the invention as set forth in the claims of the present application is intended to encompass all substitutions, alterations and equivalents that fall within the spirit of the invention as defined in the claims of the present application and the scope of the claims of the present application.

The invention as set forth in the claims of the present application will be described specifically and in detail in order to provide a full understanding of the invention as set forth in the claims of the present application.

However, as is clear to those skilled in the art, the invention as set forth in the claims of the present application may be also carried out even without using all the elements described specifically and in detail below.

Well-known components and circuits may not be described in detail in order not to make the embodiments of the present invention unnecessarily complicated.

It should be noted, however, that all of these and similar terms are to be associated with the appropriate physical quantities and are merely convenient labels applied to these quantities.

Background on Why the Embodiments of the Present Invention Have Been Made

First, to help understanding the embodiments of the present invention, the background on why the embodiments of the present invention have been made will be described.

Figure 1A:
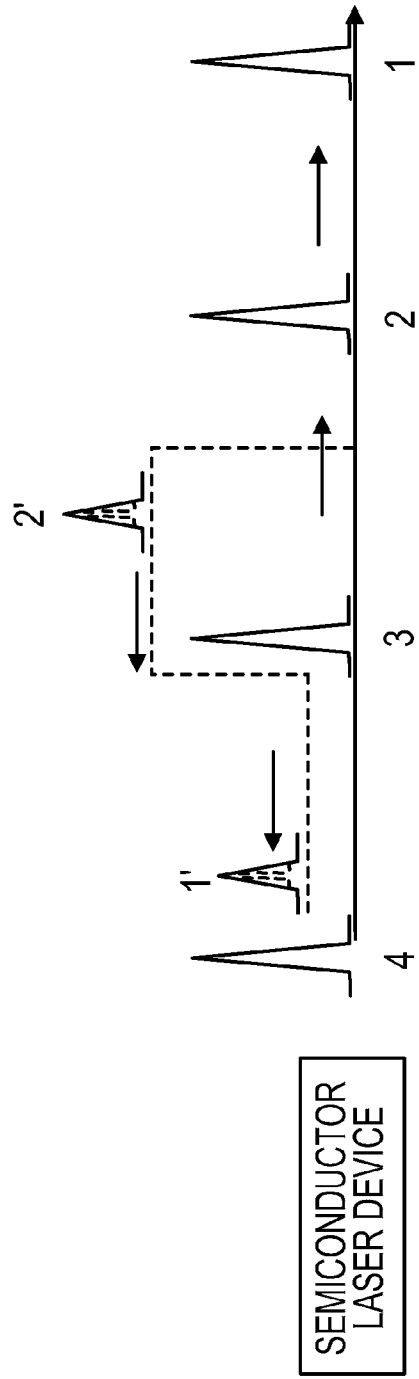
Figure 1B:
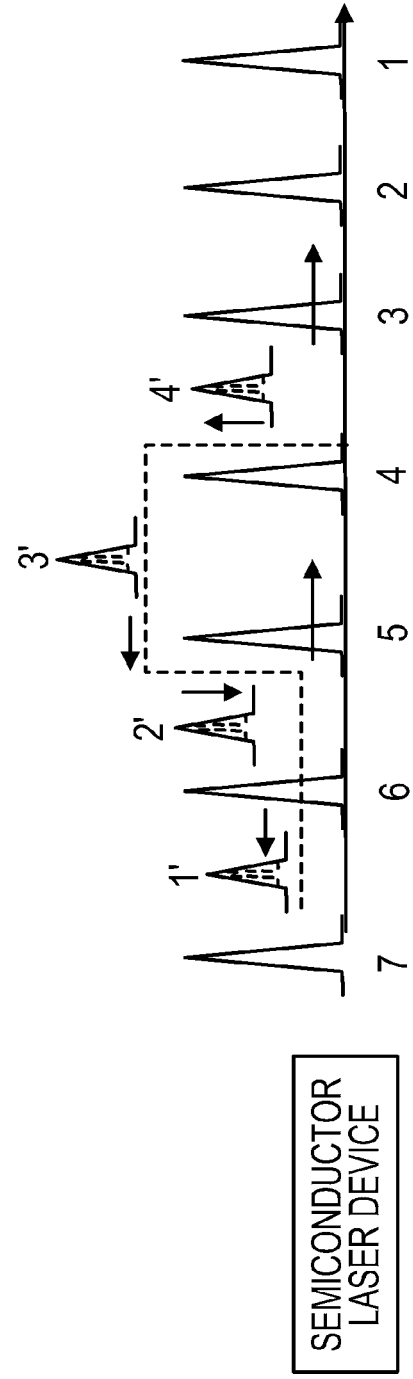

FIGS. 1A and 1B are views illustrating an example in which a pulse of a laser beam is fed back to a semiconductor laser device. FIG. 1A illustrates a case in which a pulse repetition rate per unit time is relatively low, and FIG. 1B illustrates a case in which a pulse repetition rate per unit time is relatively high.

Figure 2A:
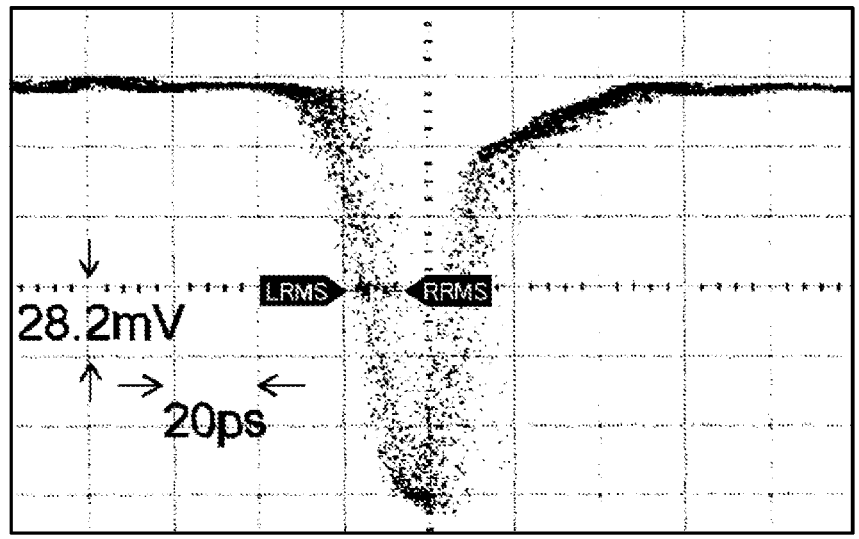
Figure 2B:
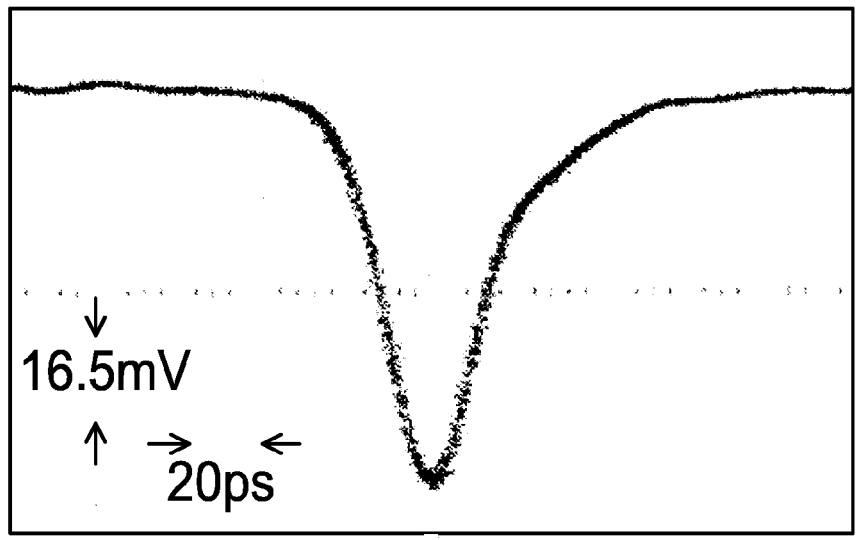

FIGS. 2A and 2B are views illustrating an example of a pulse waveform obtained according to the presence or absence of the feedback of the pulse of the laser beam to the semiconductor laser device. FIG. 2A illustrates a pulse waveform obtained when the pulse of the laser beam is not fed back to the semiconductor laser device, and FIG. 2B illustrates a pulse waveform obtained when the pulse of the laser beam is fed back to the semiconductor laser device.

As shown in FIGS. 1A and 1B, by reflecting a portion of the pulse of the laser beam generated by the semiconductor laser device (for example, a semiconductor laser diode that can be directly modulated by gain switching; a gain switched laser diode) and emitted at a point in time, and feeding the portion of the pulse back to the semiconductor laser device just before a subsequent pulse is generated, the pulse can be fed back to the semiconductor laser device.

As is understood with reference to FIGS. 1A and 1B, conditions are preferably satisfied using the same optical feedback path length in both the cases.

Because of the feedback, time jitter (referred to as jitter below) generated in the pulse that is obtained when the pulse of the laser beam is not fed back to the semiconductor laser device as shown in FIG. 2A can be significantly reduced, so that a high quality pulse having a preferable waveform with no fluctuation in the timing and waveform of the repeatedly generated pulse can be obtained as shown in FIG. 2B.

Unless the wavelength of light to be injected into the semiconductor laser device from outside for the feedback falls within the range of wavelengths that resonate with the mode of each semiconductor laser resonator, the light cannot be effectively injected into the semiconductor laser device. However, since the pulse generated by the semiconductor laser device itself is fed back, the condition is basically satisfied.

In the feedback, the optical power of the pulse of the laser beam fed back to the semiconductor laser device should be about a few microwatts, and the polarization of the laser beam should be maintained in a TE mode.

When the above conditions are satisfied, the pulse of the laser beam can be fed back to the semiconductor laser device very easily and at a very low cost. Furthermore, the pulse of the laser beam can be significantly improved in quality.

A graph shows the relationship between a pulse repetition rate per one second (unit GHz; referred to as pulse frequency below) output from the semiconductor laser device, and a jitter value (unit ps). A plurality of points indicated by squares in the graph represent a group of jitter values and frequencies under conditions to obtain a preferable pulse quality in a given optical feedback fiber length, and a plurality of points indicated by star marks in the graph represent a group of jitter values and frequencies under conditions to obtain a preferable pulse quality in a feedback fiber length slightly longer than the given optical feedback fiber length.

In the feedback, when the optical path length between a reflecting portion for reflecting and feeding the laser beam back to the semiconductor laser device and the semiconductor laser device is long, a pulse train generated at a point in time is fed back to a pulse train generated after the lapse of a long period of time from the point in time to thereby affect the pulse train.

Figure 3:
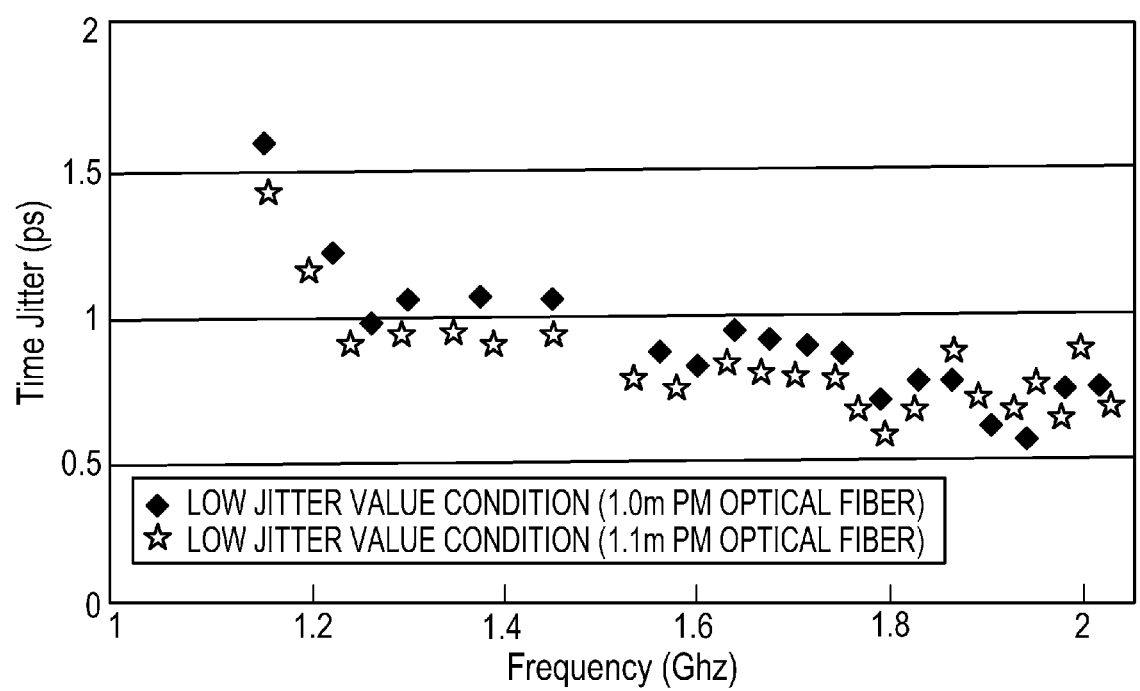
FIG. 3 is a graph illustrating the relationship between a pulse repetition rate per one second output from the semiconductor laser device and a jitter value, in which a plurality of points indicated by squares represent a group of jitter values and frequencies under conditions to obtain a preferable pulse quality in a given optical feedback fiber length, and a plurality of points indicated by star marks represent a group of jitter values and frequencies under conditions to obtain a preferable pulse quality in a feedback fiber length slightly longer than the given optical feedback fiber length.

Therefore, even when the pulse frequency changes as shown in FIGS. 1A and 1B, the conditions suitable for reducing the jitter can be obtained in a similar manner to those before the pulse frequency changes only by slightly changing the optical path length as shown in FIG. 3.

The above operation will be described in more detail with reference to a specific example.

For example, when the pulse frequency is 1 GHz and a 10-m polarization maintaining (PM) optical fiber (fiber-pigtail-code; optical path length 100 m) wound into a loop is used as the optical path, a pulse is fed back to a 100th pulse from the pulse.

Similarly, when the pulse frequency is 1.01 GHz and a 10-m PM optical fiber is used as the optical path, a pulse is fed back to a 101st pulse from the pulse. Thus, even when the pulse frequency is changed from 1 GHz to 1.01 GHz, the jitter reducing effect can be obtained from the feedback of the pulse.

Here, by slightly changing the diameter of the loop of the long optical fiber to change a tension and thereby slightly change the optical path length according to the change in the tension, the timing of feeding the pulse back to the semiconductor laser device can be adjusted. Accordingly, the pulse frequency can be adjusted to be slightly higher than 1 GHz or slightly lower than 1.01 GHz.

Because of the adjustment, the jitter and intensity fluctuations of pulses at various pulse frequencies required can be reduced.

In FIG. 3, the points indicated by the square marks represent a group of preferable conditions when no tension is applied to the optical fiber having a length of 1 m, and the points indicated by the star marks represent a group of preferable conditions when a small tension is applied to the optical fiber to extend the length.

As shown in FIG. 3, the groups of preferable conditions obtained when the tension is applied or is not applied to the optical fiber are slightly different from each other, and are repeatedly obtained.

Therefore, a user can easily perform the adjustment by changing the tension applied to the optical fiber so as to obtain the preferable conditions at the pulse frequency that is actually used.

By adjusting the feedback conditions for reducing the jitter, dynamic chirping caused by changes in electric charge concentration in the semiconductor laser device and refractive index due to direct modulation of the semiconductor laser device can be also suppressed to some extent.

This is because the pulse fed back to the semiconductor laser device increases the number of photons in the laser beam having a wavelength selected by an oscillator cavity, and electric charge fluctuations acting as the seed for oscillation of a laser beam having another wavelength and inducing stimulated emission of another wavelength are suppressed.

Figure 4:
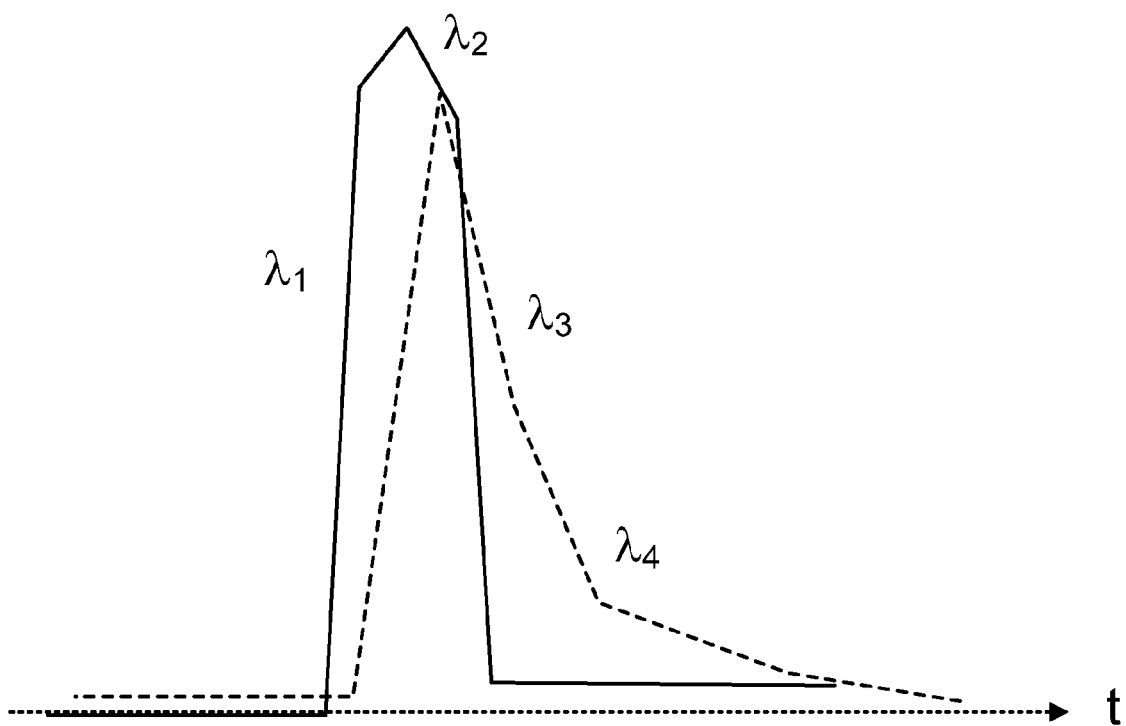
FIG. 4 is a view illustrating an example of the schematic shape (a solid line) of a desired waveform of the pulse of the laser beam, and the schematic shape (a dashed line) of an actual waveform of the pulse obtained by feeding back the pulse as described with reference to FIGS. 1 to 3.

FIG. 4 is a view illustrating an example of the schematic shape of a desired waveform of the pulse of the laser beam, and the schematic shape of an actual waveform of the pulse obtained by feeding back the pulse as described with reference to FIGS. 1 to 3.

For example, as the light source of an optical measurement apparatus for a high-speed optical communication system, the pulse of the laser beam is desired to have a symmetrical waveform at a turn-on portion and a turn-off portion as indicated by a solid line in FIG. 4.

Although the schematic shape of the waveform shown in FIG. 4 or the like is inverted from the actually measured waveform shown in FIGS. 2A and 2B or the like, the turn-on and turn-off of the pulse waveform described below are based on the pulse waveform shown in FIG. 4.

The conventional pulse of the laser beam includes dynamic wavelength chirping shift due to the combination of fluctuations in carrier density and fluctuations in resonator length as indicated by a dashed line in FIG. 4. Thus, the wavelength in the first half ($\lambda 1$) and the wavelength in the second half ($\lambda 2$ to $\lambda 4$) of the pulse are slightly different from each other.

Moreover, the second half of the waveform of the pulse indicated by the dashed line in FIG. 4 is not symmetrical to the turn-on portion in the first half of the waveform of the pulse, and includes side robes and a pedestal whereby the turn-off portion is gently inclined.

The chirping, and the side robes and the pedestal in the second half of the pulse caused by the chirping do not directly affect the quality of waveform shaping a lot in comparison with the original pulse width, turn-on and turn-off.

However, the chirping, the side robes and the pedestal greatly affect the quality of waveform shaping when waveform processing for further reducing the pulse width is performed on the light pulse by linear compression by wavelength dispersion correction or nonlinear compression by spectral expansion since the chirping, the side robes and the pedestal become an obstacle to an ideal compression process.

That is, since the pulse of the laser beam fed back to the semiconductor laser device also includes the difference in wavelength between the first half and the second half of the pulse, and the side robes and pedestal of the waveform as shown in FIG. 4, the pulse fed back to the semiconductor laser device also affects the fluctuations in the wavelength and the waveform in the second half of the pulse generated by the semiconductor laser device.

In other words, the desired waveform cannot be obtained only by directly feeding the pulse back to the semiconductor laser device as described with reference to FIGS. 1 to 3.

The embodiments of the present invention described below have been made in view of the background described above. In the embodiments, the wavelength of the pulse to be fed back to the semiconductor laser device is selected, so that the fluctuations in the wavelength and the waveform in the second half of the pulse generated by the semiconductor laser device as shown in FIG. 4 can be suppressed.

Figure 5A:
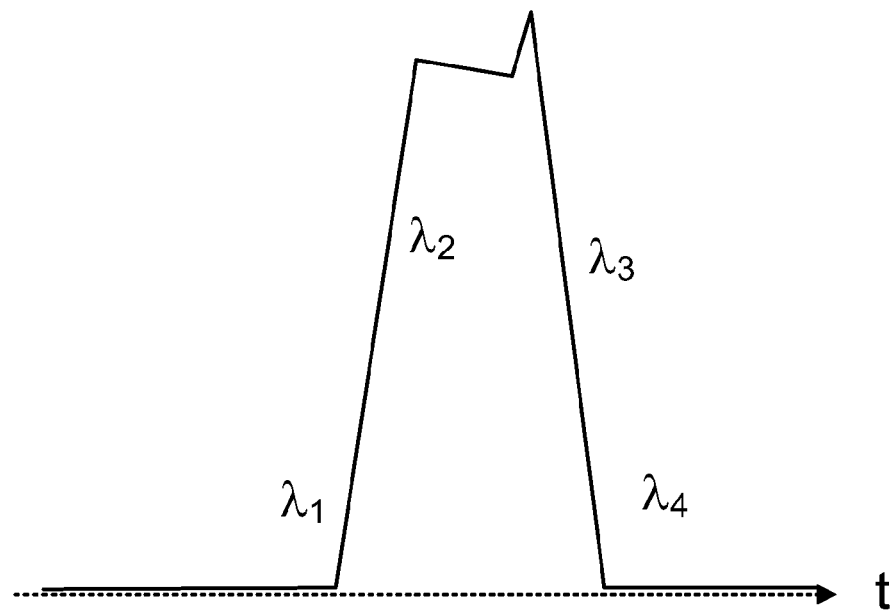
Figure 5B:
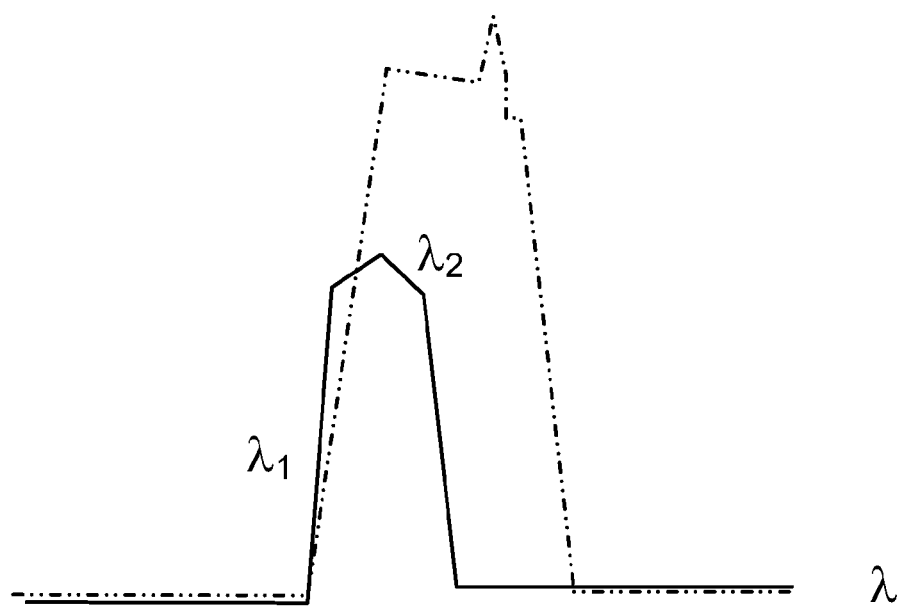

FIGS. 5A and 5B are views illustrating the schematic shape of a wavelength spectrum of the pulse of the laser beam fed back to the semiconductor laser device. FIG. 5A illustrates a wavelength spectrum included in a pulse whose band is not limited, and FIG. 5B illustrates a wavelength spectrum included in a feedback pulse whose band is limited.

As described below, in the embodiments of the present invention, specifically, only a wavelength spectrum component $\lambda 1$ in the first half portion of the waveform of the pulse of FIG. 5B is selected from the pulse of the laser beam including wavelength spectrum components $\lambda 1$ to $\lambda 4$ as shown in FIG. 5A, and the pulse having the wavelength spectrum component $\lambda 1$ is fed back to the semiconductor laser device.

By selectively feeding only the wavelength spectrum component $\lambda 1$ in the first half portion of the waveform of the pulse of the laser beam back to the semiconductor laser device by adjusting the timing as described above, the waveform of the pulse turns on and turns off more steeply, and the difference in the wavelength between the first half and the second half of the pulse, and the side robes and pedestal of the waveform shown in FIG. 4 can be improved (the light pulse is closer to the transform limit).

EMBODIMENTS OF THE PRESENT INVENTION

In the following, the embodiments according to the present invention will be described.

Figure 6:
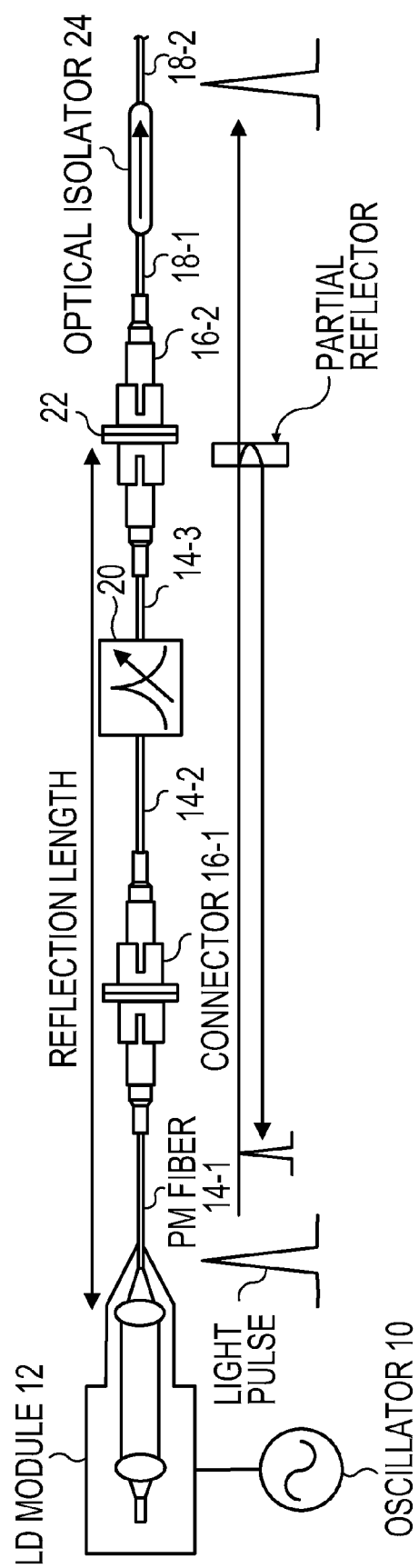
FIG. 6 is a first view illustrating an embodiment of the present invention, which illustrates the configuration of a first laser pulse generating apparatus.

FIG. 6 is a first view illustrating an embodiment of the present invention, which illustrates the configuration of a first laser pulse generating apparatus 1.

As shown in FIG. 6, the first laser pulse generating apparatus 1 includes a transmitter 10 (a driving device), a laser diode module (an LD module; a laser beam generating device) 12, PM optical fibers 14-1 to 14-3 (first to fifth light guide paths), connectors 16-1 and 16-2, any and normal optical fibers 18-1 and 18-2, an optical filter 20, a partial reflector 22 (a reflecting device), and an optical isolator 24.

In the following, a plurality of components, for example, the optical fibers 18-1 and 18-2 may be collectively referred to as the optical fibers 18 or the like.

The substantially same components are assigned the same reference numerals in the following respective drawings.

The transmitter 10 drives the LD module 12 to generate a laser beam pulse.

The LD module 12 is a butterfly laser diode module that can be directly modulated by a gain switching method, a less-expensive and simple TOSA module, or a diode pumped solid state (DPSS) laser, for example, and is driven by the transmitter 10 to generate the laser beam pulse and emit the pulse to the PM optical fiber 14.

The LD module 12 also receives the pulse fed back via the PM optical fibers 14-1 to 14-3 and the optical filter 20.

The PM optical fiber 14-1 is connected to the PM optical fiber 14-2 via the connector 16-1, and guides the pulse between the LD module 12 and the connector 16-1 while maintaining the polarization.

Each of the PM optical fibers 14-1 and 14-3 is adjusted to have an appropriate length so as to adjust the timing such that a previous pulse is fed back to the LD module 12 just before the LD module 12 generates a pulse.

When the pulse frequency is continuously changed, the lengths of the PM optical fibers 14-1 and 14-3 need to be accurately adjusted little by little.

Such adjustment is enabled by allowing the PM optical fibers 14-1 and 14-3 to expand and contract according to the tension applied.

Figure 7:
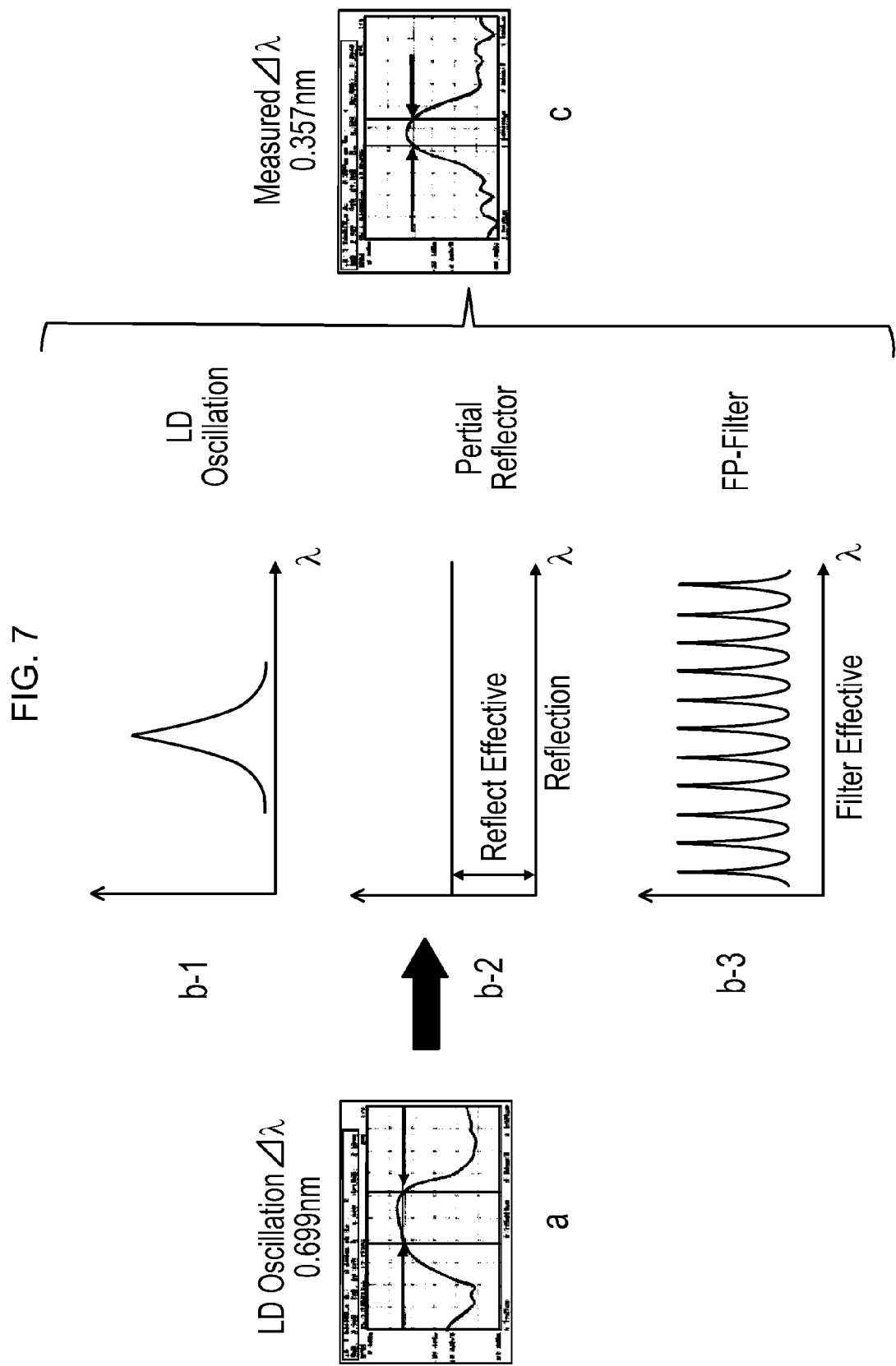
FIG. 7 is a view illustrating the operation of the first laser pulse generating apparatus shown in FIG. 6.

FIG. 7 is a view illustrating the operation of the first laser pulse generating apparatus 1 shown in FIG. 6.

The PM optical fiber 14-2 is connected to the PM optical fiber 14-1 and the optical filter 20, and guides the pulse therebetween.

The optical filter 20 is an FP (Fabry-Perot) filter having narrow bandpass characteristics and whose passband can be adjusted, for example. The optical filter 20 transmits only the wavelength spectrum in the first half of the pulse (a short-wavelength portion in the oscillation wavelength) shown in FIG. 4 or the like out of the wavelength spectrum of the pulse entering from the PM optical fiber 14-2 and emits the pulse to the PM optical fiber 14-3.

The optical filter 20 also transmits only the wavelength spectrum in the first half of the pulse shown in FIG. 4 or the like out of the wavelength spectrum of the pulse entering from the PM optical fiber 14-3 and emits the pulse having the wavelength spectrum to the PM optical fiber 14-2.

The pulse output from the optical filter 20 includes a wavelength spectrum obtained by multiplying the wavelength spectrum of the laser beam emitted from the LD module 12 shown in FIG. 7($b$-1), and the characteristics of the optical filter 20 shown in FIG. 7($b$-3).

The optical filter 20 may have the characteristics of an etalon filter used for reducing the passband width with the same finess (the steepness of a transmission band per peak interval) so as to obtain a narrow band as shown in FIG. 7($b$-3), or the characteristics that the passing wavelength has a single peak.

Although the etalon optical filter having comb characteristics as described above is difficult to form, there is obtained an advantage that the etalon optical filter can respond to a change to another LD module having a different oscillation wavelength from that of the LD module 12 by slightly sifting the comb characteristics when the etalon optical filter is employed.

The PM optical fiber 14-3 is connected to the optical filter 20, and is connected to the optical fiber 18-1 via the partial reflector 22 housed in the connector 16-2. The PM optical fiber 14-3 guides the pulse between the optical filter 20 and the optical fiber 18-1.

The partial reflector 22 is disposed in the connector 16-2 so as to be held between the end surfaces of the PM optical fiber 14-3 and the optical fiber 18-1.

The partial reflector 22 has a thin film (a DLC film) where a high refractive index material is deposited on a glass plate shaped so as to be housed in the connector 16-2, for example, to obtain characteristics shown in FIG. 7(b-2), and thereby transmits 95 to 99.5% (specifically, 98%, for example) of the pulse entering from the PM optical fiber 14-3 and emits the 95 to 99.5% of the pulse to the optical fiber 18-1.

The partial reflector 22 also reflects the remaining portion of the pulse except the transmitted portion, and emits the remaining portion to the PM optical fiber 14-3.

The optical fiber 18-1 connects the PM optical fiber 14-3 and the optical isolator 24, and guides the pulse between the optical isolator 24 and the PM optical fiber 14-3.

The optical isolator 24 prevents (isolates) the pulse emitted from the optical fiber 18-1 from being reflected and returning to the components of the laser pulse generating apparatus 1 from the LD module 12 to the partial reflector 22 by emitting the pulse entering from the optical fiber 18-1 to the optical fiber 18-2, and preventing light entering from the optical fiber 18-2 from entering the PM optical fiber 14-3.

The pulse entering the optical fiber 18-2 is guided to an optical measurement apparatus and is used as the light source for measurement, for example.

[Entire Operation of the First Laser Pulse Generating Apparatus 1]

In the following, the entire operation of the first laser pulse generating apparatus 1 shown in FIG. 6 will be described.

As shown in FIG. 7(a), the transmitter 10 drives the LD module 12 to generate the pulse of the laser beam having a wavelength spectrum width of about 0.6 to 0.7 nm, and emit the pulse to the PM optical fiber 14-1.

As shown in FIG. 7(b-1), the PM optical fiber 14-1 emits the entering pulse to the PM optical fiber 14-2 via the connector 16-1 while maintaining the polarization of the pulse.

The PM optical fiber 14-1 also adjusts the timing of feeding the pulse back to the LD module 12.

The optical filter 20 filters the entering pulse with the characteristics as shown in FIG. 7(b-3) to transmit the wavelength spectrum in the first half of the pulse (λ1; FIG. 4 or the like), and emit the pulse having the wavelength spectrum to the PM optical fiber 14-3.

The PM optical fiber 14-3 emits the pulse entering from the optical filter 20 to the partial reflector 22 incorporated in the connector 16-2.

The partial reflector 22 transmits 98%, for example, of the pulse entering from the PM optical fiber 14-3, emits the 98% of the pulse to the optical fiber 18-1, and reflects the remaining portion back to the PM optical fiber 14-3 with the characteristics as shown in FIG. 7(b-2).

The optical fiber 18-1 outputs the entering pulse to the outside via the optical isolator 24 and the optical fiber 18-2.

Meanwhile, the pulse reflected by the partial reflector 22 is fed back to the LD module 12 via the PM optical fiber 14-3, the optical filter 20, the PM optical fiber 14-2, and the PM optical fiber 14-1 just before the LD module 12 generates a pulse.

Because of the pulse feedback to the LD module 12 as described above, the wavelength spectrum width of the pulse is reduced from about 0.6 to 0.7 nm as shown in FIG. 7(a) to about 0.3 to 0.4 nm as shown in FIG. 7(c), and the pulse is output from the laser pulse generating apparatus 1.

[Second Laser Pulse Generating Apparatus 2]

In the following, a second laser pulse generating apparatus 2 will be described as another embodiment according to the present invention.

Figure 8:
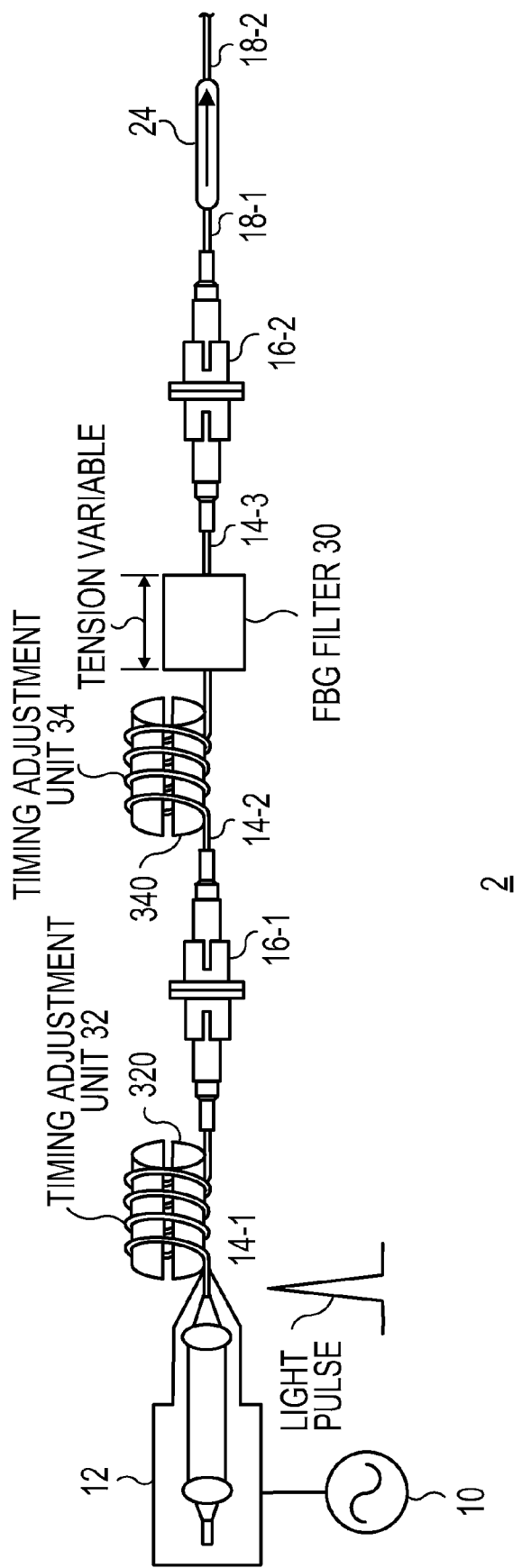
FIG. 8 is a second view illustrating an embodiment of the present invention, which illustrates the configuration of a second laser pulse generating apparatus.

FIG. 8 is a second view illustrating an embodiment of the present invention, which illustrates the configuration of the second laser pulse generating apparatus 2.

Figure 9A:
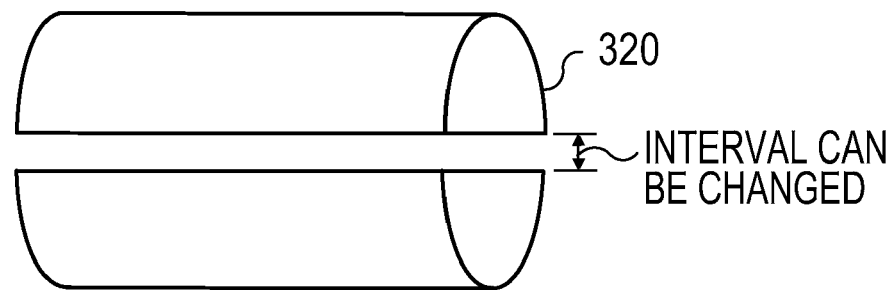
FIG. 9A is a view illustrating an example of the section of a timing adjustment unit shown in FIG. 8.
Figure 9B:
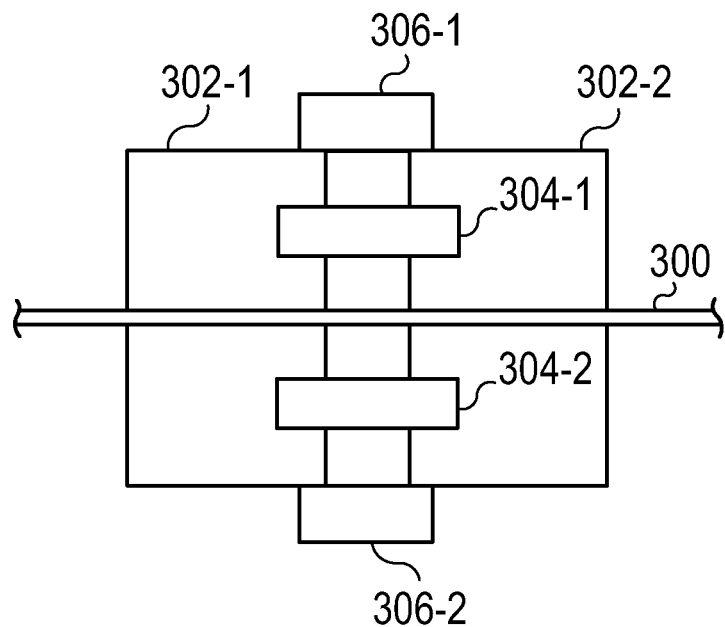
FIG. 9B is a view illustrating an example of the configuration of an FBG filter.

FIG. 9A is a view illustrating an example of the sections of timing adjustment units 32 and 34 shown in FIG. 8, and FIG. 9B is a view illustrating an example of the configuration of an FBG filter 30.

As shown in FIG. 8, the second laser pulse generating apparatus 2 has the same configuration as that of the first laser pulse generating apparatus 1 except that the coiled first and second timing adjustment units 32 and 34 are respectively added to the PM optical fibers 14-1 and 14-2.

Also, in the second laser pulse generating apparatus 2, the optical filter 20 and the partial reflecting device 22 of the first laser pulse generating apparatus 1 are replaced with the reflection FBG filter 30 (an optical reflection filter) which achieves polarization maintenance and bandpass characteristics with respect to reflected light by using an FBG having both the functions of the optical filter 20 and the partial reflecting device 22.

As shown in FIG. 9A, the timing adjustment units 32 and 34 are configured such that the PM optical fibers 14-1 and 14-2 are respectively wound around drums 320 and 340 each having an interval adjustable gap in the center.

In the timings 32 and 34, when the interval of the gap in each of the drums 320 and 340 is widened, a greater tension is applied to the PM optical fibers 14-1 and 14-2, so that the PM optical fibers 14-1 and 14-3 are extended longer.

On the other hand, when the interval of the gap in each of the drums 320 and 340 is narrowed, a smaller tension is applied to the PM optical fibers 14-1 and 14-2, so that the PM optical fibers 14-1 and 14-3 become shorter to restore the original lengths.

For example, when the length of each of the PM optical fibers 14-1 and 14-2 wound around the drums 320 and 340 is about 10 m, the optical path length can be adjusted by about a few cm to more than ten cm by adjusting the interval of the gap in each of the drums 320 and 340.

Also, as shown in FIG. 9B, in the FBG filter 30, an FBG 300 is adhered to substrates 302-1 and 302-2 disposed with a gap therebetween, and the gap between the substrates 302-1 and 302-2 is fixed by actuators 304-1 and 304-2 made of shape-memory alloy.

Heaters 306-1 and 306-2 are arranged in the vicinity of the actuators 304-1 and 304-2, respectively.

When the heaters 306-1 and 306-2 heat or stop heating the actuators 304-1 and 304-2, the actuators 304-1 and 304-2 change in shape, so that the interval of the gap between the substrates 302-1 and 302-2 is changed, and the tension applied to the FGB 300 is thereby adjusted.

When the interval of the gap in each of the drums 320 and 340 of the first and second timing adjustment units 32 and 34 is widened as shown in FIG. 9A, the PM optical fibers 14-1 and 14-2 are extended, and a greater delay is applied to the pulse.

On the other hand, when the interval in each of the drums 320 and 340 is narrowed, the PM optical fibers 14-1 and 14-2 are contracted, and a smaller delay is applied to the pulse.

By adjusting the lengths of the PM optical fibers 14-1 and 14-2 by the timing adjustment units 32 and 34 as described above, the timing of feeding the pulse back to the LD module 12 can be adjusted.

In the FBG filter 30, the passband can be changed by changing the tension applied in the long axis direction of the FBG 300 by 1% or less with the configuration shown in FIG. 9B.

That is, by increasing the tension applied in the long axis direction of the FBG 300, the passband is moved to a long-wavelength side, and by reducing the tension applied in the long axis direction of the FBG 300, the passband is moved to a short-wavelength side.

[Method of Adjusting the Second Laser Pulse Generating Apparatus 2]

In the following, a method of adjusting the laser pulse generating apparatus 2 will be described.

FIGS. 10A and 10B are views illustrating the method of adjusting the second laser pulse generating apparatus 2 shown in FIG. 8.

In FIGS. 10A and 10B, (a-1) shows the wavelength spectrum of the pulse generated by the LD module 12, and (a-2) shows the wavelength spectrum of the pulse obtained by feeding a portion of the optical power of the pulse back to the LD module 12 without filtering the reflected light by the FBG filter 30.

Also, in FIGS. 10A and 10B, (b-1) shows the waveform of the pulse obtained by feeding a portion of the optical power of the pulse back to the LD module 12 by filtering the reflected light by the FBG filter 30, and (b-2) shows the waveform of the pulse obtained by feeding a portion of the optical power of the pulse back to the LD module 12 without filtering the reflected light by the FBG filter 30.

Also, in FIGS. 10A and 10B, (c) shows the wavelength spectrum of the pulse obtained by feeding a portion of the optical power of the pulse back to the LD module 12 by filtering the reflected light by the FBG filter 30.

First, the pulse output from the laser pulse generating apparatus 2 is observed using an oscilloscope and a spectrum analyzer that allow observation of the waveform of a light signal having a frequency of about 5 GHz.

The interval of the gap in each of the drums 320 and 340 of the timing adjustment units 32 and 34 shown in FIG. 9A is adjusted such that the time fluctuations generated in the pulse as shown in FIG. 2A are reduced as shown in FIGS. 2A and 2B, and FIG. 10(c).

Figure 10:
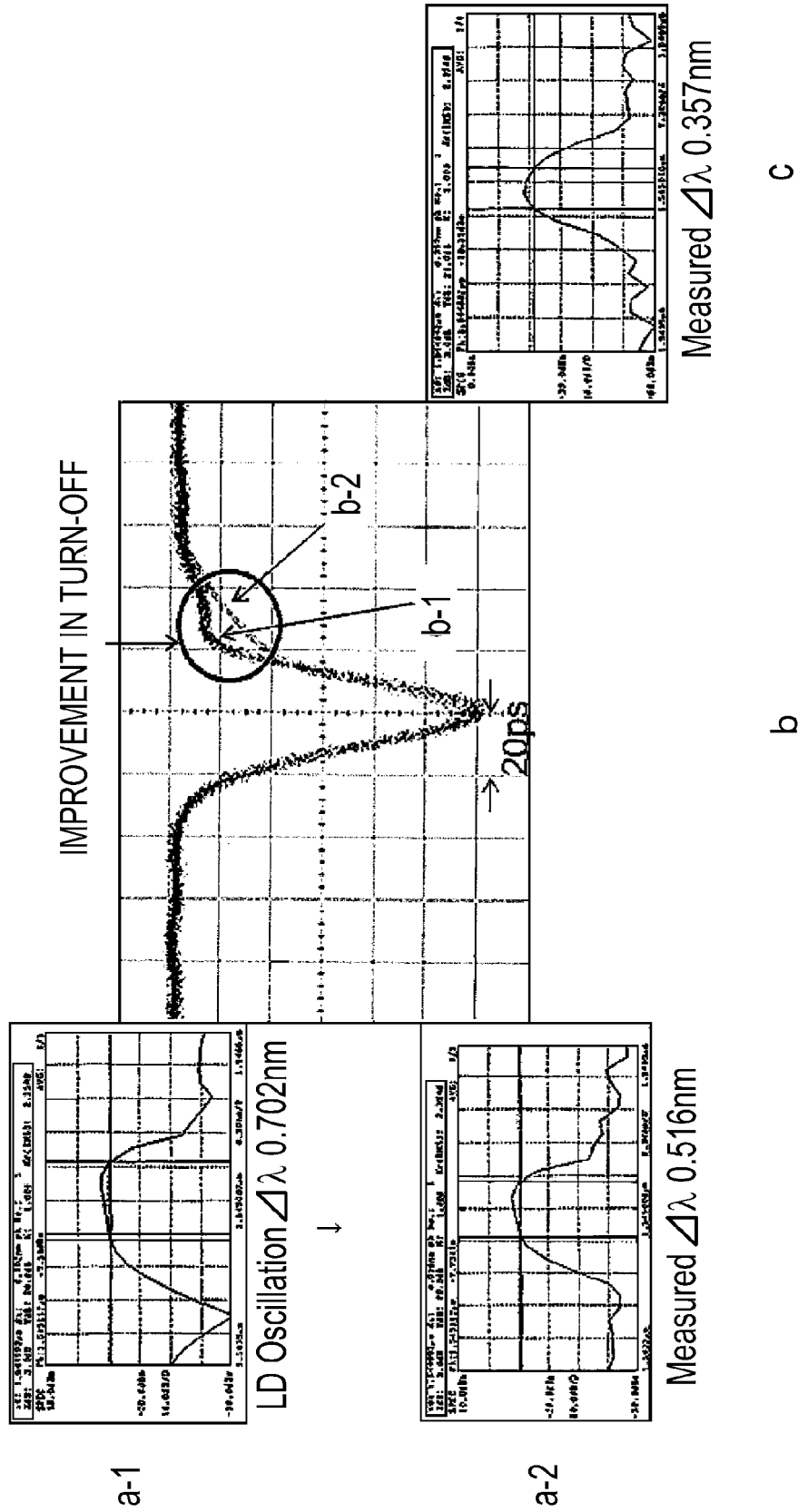
FIG. 10 is a view illustrating a method of adjusting the second laser pulse generating apparatus shown in FIG. 8.

Subsequently, the tension applied to the FBG 300 of the FBG filter 30 shown in FIG. 9B is adjusted such that the turn-off of the pulse waveform shown in FIG. 10(b-2) output from the laser pulse generating apparatus 2 becomes steepest as shown in FIG. 10(b-1).

To make the turn-off of the pulse waveform steepest and minimize the chirping and the pedestal, the center of the reflected light passband of the FBG filter 30 is normally at a 50 to 70% shorter-wavelength portion at the full width at half maximum from the oscillation peak wavelength (a wavelength shorter by 0.1 to 0.15 nm than the peak wavelength of the pulse on which no processing is performed).

As is clear from the comparison between the waveform of the pulse obtained by feeding a portion of the optical power back to the LD module 12 by filtering the reflected light by the FBG filter 30 (FIG. 10(b-1)) and the waveform of the pulse obtained by feeding a portion of the optical power of the pulse back to the LD module 12 without filtering the reflected light by the FBG filter 30 (FIG. 10(b-2)), the turn-off of the pulse waveform can be improved by the adjustment described above.

The chirping, and the side robes and the pedestal in the second half of the pulse caused by the chirping do not seem to directly affect the quality of waveform shaping a lot in comparison with the original pulse width, turn-on and turn-off.

However, since the chirping, the side robes and the pedestal become an obstacle to an ideal compression process, the chirping, the side robes and the pedestal greatly affect the quality of waveform shaping when waveform processing for further reducing the pulse width is performed on the light pulse by linear compression by wavelength dispersion correction or nonlinear compression by spectral expansion.

Therefore, a major and important problem in the application of the light pulse can be solved by improving the waveform as shown in FIG. 10(b-1).

In a similar manner to the laser pulse generating apparatus 1 (FIG. 6), the laser pulse generating apparatus 2 adjusted appropriately as described above improves the waveform of the pulse of the laser beam generated by the LD module 12 and outputs the pulse with the wavelength spectrum being reduced in width.

In a similar manner to the laser pulse generating apparatus 1 (FIG. 6), the waveform of the pulse of the laser beam generated by the LD module 12 is improved and the pulse is output with the wavelength spectrum being reduced in width by the laser pulse generating apparatus 2 adjusted appropriately as described above.

As is easily understood with reference to the frequency component of the pulse generated by the LD module 12 when the pulse is not fed back as shown in FIG. 10(a), and the wavelength spectrum of the pulse when the pulse is fed back using the FBG filter 30 as shown in FIG. 10(c), the wavelength spectrum width of the pulse is improved only from about 0.7 nm to about 0.52 nm when the pulse is fed back to the LD module 12 by using only the partial reflector 22 (FIG. 10(a)).

Meanwhile, when the optical filter 20 and the partial reflector 22 are used together (FIG. 10(c)) in the first and second laser pulse generating apparatuses 1 and 2 (FIGS. 6 and 8), the wavelength spectrum width of the pulse is significantly improved from about 0.7 nm to about 0.36 nm.

Similarly, by comparing the case in which only the partial reflector 22 is used and the case in which the optical filter 20 and the partial reflector 22 are used together, the waveform of the pulse at the turn-off is significantly improved and the oscillation spectrum broadening is also much smaller as shown in FIG. 10(b).

In comparison with the optical filter 20 (the FP filter) and the partial reflecting device 22 used in the first laser pulse generating apparatus 1, the functions of the two different components can be achieved by the single component by using the FBG filter 30 used in the second laser pulse generating apparatus 2, so that the adjustment is facilitated, and the second laser pulse generating apparatus 2 is reduced in size.

In the first laser pulse generating apparatus 1, it is also necessary to change the lengths of the PM optical fibers 14-1 and 14-3 to adjust the timing of the feedback. However, in the second laser pulse generating apparatus 2, the optical path length of the long optical fiber used for adjusting the timing of feeding the pulse back to the LD module 12 can be adjusted only by changing the diameters of the small timing adjustment units 32 and 34.

Therefore, in comparison with the timing adjustment of the pulse feedback in the first laser pulse generating apparatus 1 in which the lengths of the PM optical fibers 14-1 and 14-3 need to be finely changed to adjust the timing of the feedback, accurate and continuous timing adjustment of the pulse feedback is enabled in the second laser pulse generating apparatus 2.

[Entire Operation of the Second Laser Pulse Generating Apparatus 2]

In the following, the entire operation of the second laser pulse generating apparatus 2 will be described.

As shown in FIG. 7(a), in the second laser pulse generating apparatus 2, the transmitter 10 also drives the LD module 12 to generate the pulse of the laser beam having a wavelength spectrum width of about 0.6 to 0.7 nm, and emit the pulse to the PM optical fiber 14-1.

As shown in FIG. 7(b-1), the PM optical fiber 14-1 emits the entering pulse to the PM optical fiber 14-2 via the connector 16-1 while maintaining the polarization of the pulse.

The PM optical fiber 14-2 emits the entering pulse to the FBG filter 30 while maintaining the change of the pulse.

The FBG filter 30 transmits 98%, for example, of the pulse entering from the PM optical fiber 14-2, emits the 98% of the pulse to the optical fiber 18-1, and reflects the remaining portion.

The FBG filter 30 also filters the reflected light of the pulse entering from the PM optical fiber 14-2 with the characteristics as shown in FIG. 7(b-3) to transmit the short-wavelength spectrum in the first half of the pulse and emit the pulse having the short-wavelength spectrum to the PM optical fiber 14-3.

The FBG filter 30 shows the bandpass characteristics only against the reflected pulse and hardly shows the bandpass characteristics against the transmitted pulse.

The PM optical fiber 14-3 emits the pulse entering from the optical filter 20 to the optical fiber 18-1 connected via the connector 16-2.

The optical fiber 18-1 outputs the entering pulse to the outside via the optical isolator 24 and the optical fiber 18-2.

Meanwhile, the pulse reflected by the FBG filter 30 is fed back to the LD module 12 via the PM optical fibers 14-2 and 14-1 just before the LD module 12 generates a pulse.

Because of the pulse feedback to the LD module 12 as described above, the wavelength spectrum width of the pulse is reduced from about 0.6 to 0.7 nm as shown in FIG. 7(a) to about 0.3 to 0.4 nm as shown in FIG. 7(c), and the pulse is output from the laser pulse generating apparatus 2.

The aforementioned embodiments are provided for illustrative and explanatory purposes only, and do not encompass every embodiment of the invention as set forth in the claims of the present application.

The aforementioned embodiments are not intended to limit the technical scope of the invention as set forth in the claims of the present application to the disclosure, and may be variously changed and modified in the light of the disclosure.

The aforementioned embodiments are chosen and described in an effort to provide the best illustrations of the principles of the invention as set forth in the claims of the present application and their practical application and to thereby enable those skilled in the art to utilize the invention as set forth in the claims of the present application and the embodiments with various modifications as are suited to all practical uses contemplated based on the disclosure of the embodiments.

The technical scope of the invention as set forth in the claims of the present application is intended to be defined by the description and equivalents thereto.

For example, the PM optical fibers 14 and the optical fibers 18 may be replaced with glass-plate or plastic light guiding means as long as the first and second laser pulse generating apparatuses 1 and 2 can deliver equivalent performance.

In the first and second laser pulse generating apparatuses 1 and 2, the optical filter 20 and the FBG filter 30 may be replaced with a DLC, a high-pass filter, a low-pass filter, an all-pass filter, and a combination of two or more of them as long as the first and second laser pulse generating apparatuses 1 and 2 can deliver equivalent performance.

The first laser pulse generating apparatus 1 may include the timing adjustment unit 32 in at least one of the PM optical fibers 14-1, 14-2, and 14-3 in a similar manner to the second laser pulse generating apparatus 2.

In the second laser pulse generating apparatus 2, the PM optical fiber 14-3 may be replaced with a normal optical fiber 18.

In the second laser pulse generating apparatus 2, the PM optical fibers 14-1 and 14-2 may be replaced with a single PM optical fiber 14.

Also, the second laser pulse generating apparatus 2 may include only one of the timing adjustment units 32 and 34.

INDUSTRIAL APPLICABILITY

The invention as set forth in the claims of the present application can be used for generating a laser beam pulse having a narrow width.

DESCRIPTION OF SYMBOLS 1,2 ... Laser pulse generating apparatus
10 ... Transmitter
12 ... LD module
14 ... PM optical fiber
16 ... Connector
32,34 ... Timing adjustment unit
320,340 ... Drum
18 ... Optical fiber
20 ... Optical filter
22 ... Partial reflector
24 ... Optical isolator
30 ... FBG filter
300 ... FBG
302 ... Substrate
304 ... Actuator
306 ... Heater

The invention claimed is:

1. A laser pulse generating apparatus comprising:
a laser beam generating device;
a driving device;
a first light guide path comprising a first optical fiber;
an optical filter;
a second light guide path comprising a second optical fiber; and
a reflecting device,
wherein the laser beam generating device is configured to generate a laser beam having a predetermined wavelength spectrum and emit the laser beam to the first light guide path in a first direction,
wherein the driving device is configured to drive the laser beam generating device to generate a pulse of the laser beam,
wherein the first light guide path is configured to guide to the optical filter the pulse entering from the first direction from the laser beam generating device, and guide to the laser beam generating device a portion of optical power of the pulse fed back to the laser beam generating device in a second direction opposite to the first direction,
wherein the optical filter is a bandpass filter configured to transmit a portion of the predetermined wavelength spectrum of the pulse of the laser beam entering from the first light guide path to the second light guide path and transmit the portion of the predetermined wavelength spectrum of the pulse of the laser beam entering from the second light guide path to the first light guide path, wherein the portion of the predetermined wavelength spectrum of the pulse of the laser beam includes a first half of the pulse but not a second half of the pulse, wherein the second light guide path is configured to guide the pulse between the optical filter and the reflecting device, wherein the reflecting device is configured to reflect only a portion of optical power of the pulse guided through the second light guide path to feed the portion back to the laser beam generating device via the second light guide path, the optical filter, and the first light guide path, and wherein a timing of the feedback of the portion of the optical power of the pulse to the laser beam generating device is adjusted such that the portion of the optical power of the pulse is fed back to the laser beam generating device just before a subsequent pulse is generated.

2. The laser pulse generating apparatus according to claim 1, further comprising:
a third light guide path configured to guide the pulse passing through the reflecting device.

3. The laser pulse generating apparatus according to claim 1, wherein the first light guide path comprises:
a fourth light guide path; and
a fifth light guide path,
wherein the fourth light guide path is configured to guide the pulse between the laser beam generating device and the fifth light guide path while maintaining polarization, and
wherein the fifth light guide path is configured to guide the pulse between the optical filter and the fourth light guide path.

4. The laser pulse generating apparatus according to claim 1, wherein the reflecting device reflects 0.5 to 5% of the optical power of the entering pulse.

5. The laser pulse generating apparatus according to claim 1, wherein the laser beam generating device is a semiconductor laser device or a diode pumped solid state laser.

6. The laser pulse generating apparatus of claim 1, wherein the portion is a short wavelength portion of the pulse of the laser beam.

7. The laser pulse generating apparatus of claim 1, wherein the first and second optical fibers are configured to maintain polarization of the pulse of the laser beam.

8. A method of generating a laser pulse, comprising:
driving a laser beam generating device to generate a pulse of a laser beam having a predetermined wavelength spectrum and emit the pulse of the laser beam to a first light guide path in a first direction, wherein the first light guide path comprises a first optical fiber;
guiding the pulse, via the first light guide path, to an optical filter having bandpass characteristics to transmit a portion of the predetermined wavelength spectrum, and guiding a portion of optical power of the pulse fed back to the laser beam generating device to the laser beam generating device through the first light guide path in a second direction opposite to the first direction;
transmitting the portion of the predetermined wavelength spectrum of the pulse entering from the first light guide path through the optical filter to emit the pulse to a second light guide path, wherein the second light guide path comprises a second optical fiber, and transmitting the portion of the predetermined wavelength spectrum of the pulse entering from the second light guide path through the optical filter to emit the pulse to the first light guide path, wherein the portion of the predetermined wavelength spectrum of the pulse of the laser beam includes a first half of the pulse but not a second half of the pulse,;
guiding the pulse through the second light guide path between the optical filter and a reflecting device;
reflecting only a portion of the pulse guided through the second light guide path by the reflecting device to feed the portion back to the laser beam generating device via the second light guide path, the optical filter, and the first light guide path; and
adjusting a timing of the feedback of the portion of the pulse to the laser beam generating device such that the portion of the pulse is fed back to the laser beam generating device just before a subsequent pulse is generated.

9. The method of claim 8, wherein the portion of the predetermined wavelength spectrum of the pulse of the laser beam includes a first half of the pulse but not a second half of the pulse.

10. The method of claim 8, wherein the portion of the predetermined wavelength spectrum is a short wavelength portion of the pulse of the laser beam.

11. The method of claim 8, further comprising altering a timing of the feedback of the reflected portion of the pulse by adjusting a tension of at least one of the first optical fiber or the second optical fiber.

12. The method of claim 10, wherein the portion of the predetermined wavelength spectrum is changed according to the adjusting the tension of the at least one of the first optical fiber or the second optical fiber.

13. The method of claim 8, wherein the first and second optical fibers are configured to maintain polarization of the pulse of the laser beam.

14. The method of claim 8, further comprising guiding the pulse along a third light guide path that comprises a third optical fiber.

15. The method of claim 8, wherein the reflecting device is configured to reflect 0.5 to 5% of the optical power of the entering pulse.

16. The method of claim 8, wherein the laser beam generating device comprises a semiconductor laser device or a diode pumped solid state laser.

* * * * *

UNITED STATES PATENT AND TRADEMARK OFFICE
CERTIFICATE OF CORRECTION

PATENT NO.         : 8,073,018 B2                                    Page 1 of 1
APPLICATION NO.    : 12/665636
DATED              : December 6, 2011
INVENTOR(S)        : Nonaka It is certified that error appears in the above-identified patent and that said Letters Patent is hereby corrected as shown below:

In the drawings:
In Fig. 7, Sheet 7 of 10, delete "Pertial Reflector" and insert -- Partial Reflector --, therefor.

In Column 1, Line 33, delete "2008" and insert -- 2008. --, therefor.

In Column 10, Line 55, delete "FGB" and insert -- FBG --, therefor.

In Column 16, Line 16, in Claim 8, delete "pulse,;" and insert -- pulse; --, therefor.

Signed and Sealed this
Twenty-ninth Day of May, 2012

David J. Kappos
*Director of the United States Patent and Trademark Office*